United States Patent
Grodzki et al.

(10) Patent No.: US 12,399,245 B2
(45) Date of Patent: Aug. 26, 2025

(54) METHOD FOR OPERATING A MAGNETIC RESONANCE APPARATUS, MAGNETIC RESONANCE APPARATUS AND COMPUTER PROGRAM PRODUCT

(71) Applicant: Siemens Healthcare GmbH, Erlangen (DE)

(72) Inventors: David Grodzki, Erlangen (DE); Patrick Liebig, Erlangen (DE); Christian Eisen, Nuremberg (DE)

(73) Assignee: Siemens Healthineers AG, Forchheim (DE)

( * ) Notice: Subject to any disclaimer, the term of this patent is extended or adjusted under 35 U.S.C. 154(b) by 180 days.

(21) Appl. No.: 18/224,750

(22) Filed: Jul. 21, 2023

(65) Prior Publication Data
US 2024/0036139 A1    Feb. 1, 2024

(30) Foreign Application Priority Data
Jul. 29, 2022 (DE) ...................... 10 2022 207 841.1

(51) Int. Cl.
*G01V 3/00* (2006.01)
*G01R 33/54* (2006.01)
*G01R 33/56* (2006.01)

(52) U.S. Cl.
CPC ....... *G01R 33/5608* (2013.01); *G01R 33/543* (2013.01)

(58) Field of Classification Search
CPC .......................... G01R 33/5608; G01R 33/543
USPC ........................................................ 324/307
See application file for complete search history.

(56) References Cited

U.S. PATENT DOCUMENTS

| | | | | |
|---|---|---|---|---|
| 6,531,869 | B1* | 3/2003 | Speier | G01V 3/32 324/306 |
| 8,890,527 | B1* | 11/2014 | Balcom | G01R 33/246 324/309 |
| 2020/0096580 | A1* | 3/2020 | Hoecht | H04R 3/005 |
| 2020/0167975 | A1* | 5/2020 | Popescu | G06F 18/217 |
| 2020/0219252 | A1* | 7/2020 | Tsuyuki | A61B 6/488 |
| 2021/0278492 | A1 | 9/2021 | Grodzki et al. | |
| 2023/0176155 | A1 | 6/2023 | Grodzki et al. | |

FOREIGN PATENT DOCUMENTS

JP        2017108992 A  *  6/2017

OTHER PUBLICATIONS

KR 20150004285 A (Nlttka) (Year: 2015).*

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

The disclosure relates to a method for operating a magnetic resonance apparatus, to a magnetic resonance apparatus, and to a computer program product. According to the method, a pre-measurement is carried out by the magnetic resonance apparatus, wherein carrying out the pre-measurement includes acquiring pre-measurement data for the object under examination. The pre-measurement data is evaluated to ascertain evaluation information. The evaluation information is used to determine whether a B1 field map needs to be measured.

14 Claims, 3 Drawing Sheets

(56) References Cited

OTHER PUBLICATIONS

Herrler, Jürgen, et al. "Fast online-customized (FOCUS) parallel transmission pulses: a combination of universal pulses and individual optimization." Magnetic resonance in medicine 85.6 (2021): 3140-3153.

Lundervold, Alexander Selvikvåg, and Arvid Lundervold. "An overview of deep learning in medical imaging focusing on MRI." Zeitschrift für Medizinische Physik 29.2 (2019): 102-127.

Wu, Yan, et al. "Estimation of B1 Map from a Single MR Image Using a Self-Attention Deep Neural Network." pp. 1-2. 2021.

\* cited by examiner

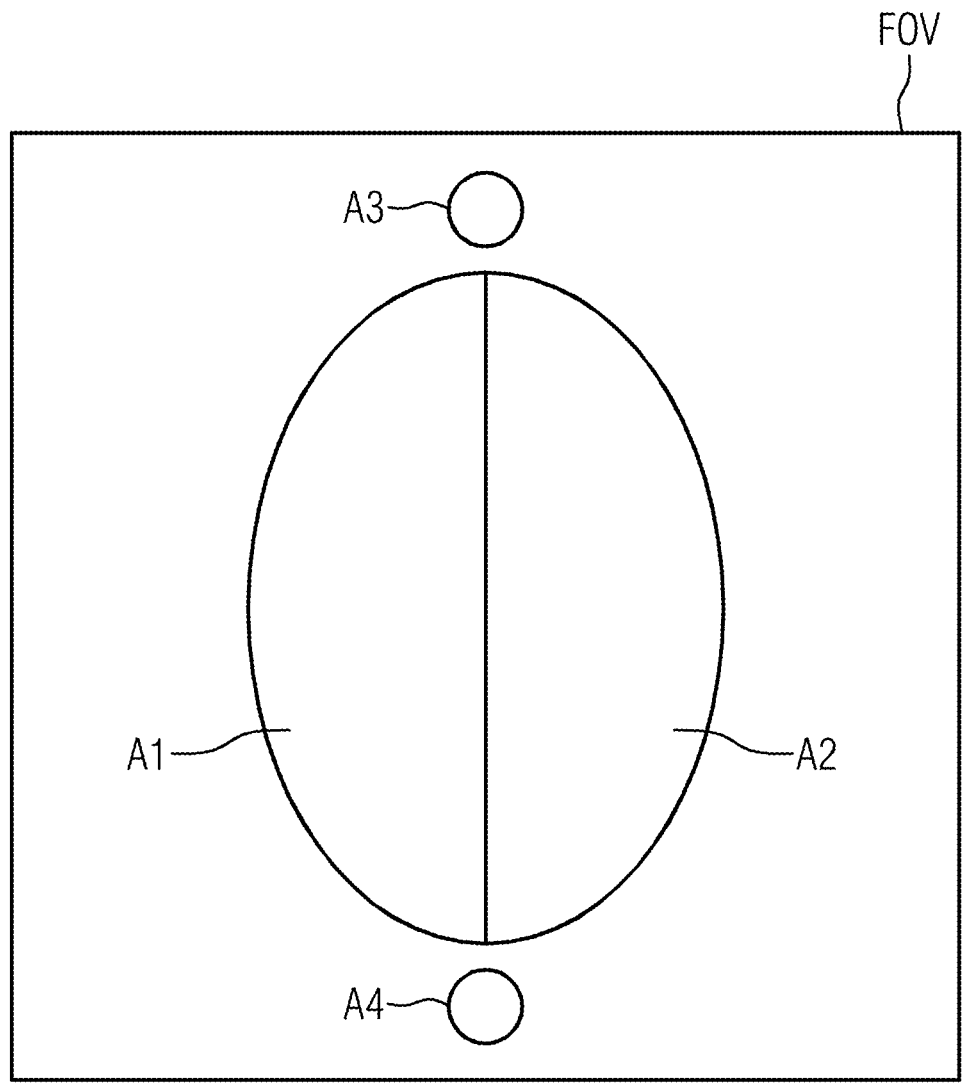

METHOD FOR OPERATING A MAGNETIC RESONANCE APPARATUS, MAGNETIC RESONANCE APPARATUS AND COMPUTER PROGRAM PRODUCT

The present patent document claims the benefit of German Patent Application No. 10 2022 207 841.1, filed Jul. 29, 2022, which is hereby incorporated by reference in its entirety.

TECHNICAL FIELD

The disclosure relates to a method for operating a magnetic resonance apparatus, to a magnetic resonance apparatus, and to a computer program product. BACKGROUND In medical technology, imaging by way of magnetic resonance (MR), also known as magnetic resonance tomography (MRT) or magnetic resonance imaging (MRI), is distinguished by high soft tissue contrast. Such imaging involves using a magnetic resonance apparatus to irradiate radio-frequency (RF) excitation pulses for generating an RF field (also known as a B1 field) and gradient pulses for generating magnetic field gradients into an examination region in which an object under examination is situated. The object under examination may be a patient. In this way, spatially encoded echo signals are triggered in the object under examination. The echo signals may also be called magnetic resonance signals. The magnetic resonance signals are received as measurement data by the magnetic resonance apparatus and used to reconstruct magnetic resonance images.

Frequently, RF pulses, which are static to a greater or lesser degree, may be used (>99%) for excitation or preparation, (for example, "sinc pulses" that differ for measurement only in phase, frequency, bandwidth, and amplitude).

In addition to these pulses, there are also "dynamic pulses," in particular multichannel or pTx pulses, which adapt to specific B0 and B1 distributions and/or target states in the spatial domain. pTx pulses may be designed such that they provide a uniform B1 distribution in the measurement volume or targeted excitation of samples in the object under examination.

However, the preparation of dynamic pulses may require a really long period of time. On the one hand, additional measurements may be carried out, such as the measurement of B1 and/or B0 field maps (e.g., taking several seconds). On the other hand, the calculation of the pulses requires a certain amount of computing time, on top of the measurement time of the actual main measurement.

SUMMARY AND DESCRIPTION

The object of the present disclosure may be considered that of reducing the measurement time in the case of magnetic resonance measurements using dynamic pulses.

The scope of the present disclosure is defined solely by the appended claims and is not affected to any degree by the statements within this summary. The present embodiments may obviate one or more of the drawbacks or limitations in the related art.

Accordingly, a method for operating a magnetic resonance apparatus is proposed. This method involves carrying out a pre-measurement by way of the magnetic resonance apparatus, wherein carrying out the pre-measurement includes acquiring pre-measurement data for the object under examination. The pre-measurement data is evaluated to ascertain evaluation information. The evaluation information is used to determine whether a B1 field map needs to be measured. If not, a (time-consuming) measurement of a B1 field map may advantageously be dispensed with.

On the other hand, according to the prior art, in particular in the case of (main) measurements in which a dynamic pulse is to be used, it is standard for a B1 field map to be measured. According to the proposed method, in contrast, it is investigated prior to a measurement of a B1 field map whether this is actually needed, so that measurement of the B1 field map may be dispensed with in order to save time. This decision is taken based on the pre-measurement data.

A B1 field map, or B1 map for short, may be a spatial representation of a B1 field. The B1 field map may cover the spatial region from which magnetic resonance signals are acquired in a main measurement.

Pre-measurement data may refer to data acquired prior to a main measurement. The main measurement may be suitable for acquiring diagnostically evaluable and/or image-generating magnetic resonance signals. In particular, the pre-measurement data describes and/or images at least one part of the object under examination. One or more magnetic resonance images may be produced from the magnetic resonance signals acquired in the main measurement.

Pre-measurement data may include one or more of the following: (1) data for localizing an object under examination within the magnetic resonance apparatus, (i.e., "localizer data"); (2) data for, in particular automatic, orientation of measurement regions, e.g., a measurement slice and/or a measurement volume relative to the object under examination, for a main measurement, (i.e., "AutoAlign data"); (3) data for determining the illumination of a radio-frequency antenna arrangement, in particular the sensitivity of its transmit and/or receive coils, of the magnetic resonance apparatus, (i.e., "coil sensitivity data"); (4) data for tuning the magnetic resonance apparatus, in particular the radio-frequency antenna arrangement, to the resonant frequency of the magnetic main field (Larmor frequency), (i.e., "frequency adjusting data"); or (5) data for homogenizing the B0 field, (i.e., "B0 shimming data").

Suitable pre-measurement data for ascertaining the evaluation information by evaluating the pre-measurement data may be localizer data and/or AutoAlign data and/or coil sensitivity data. AutoAlign data advantageously has a defined (image) contrast and the protocol for recording the AutoAlign data may not be changed by an operator of the magnetic resonance apparatus. As a result, the pre-measurement data may advantageously be particularly reproducibly acquired.

The pre-measurement data for ascertaining the evaluation information is suitable in particular for ascertaining anatomical properties of the object under examination therefrom. The pre-measurement data for ascertaining the evaluation information is suitable in particular for ascertaining comparison areas, wherein pre-measurement data assignable to the comparison areas enables estimation of the spatial profile of a B1 field. For example, pixels and/or voxels of a magnetic resonance image, which may be calculated from the pre-measurement data and/or correspond to the pre-measurement data, may be located in the comparison areas.

The pre-measurement data may include image data ascertained from magnetic resonance signals acquired during the pre-measurement. The pre-measurement data may include a magnitude image, which is in particular two-dimensional. Advantageously, anatomical properties of the object under examination may be particularly well ascertained therewith.

The spatial resolution of the pre-measurement data is advantageously similar, (e.g., identical), to main measurement data that may be acquired during the main measurement. The pre-measurement data is advantageously maximally reproducible. A fixed and/or unmodified protocol is advantageously used to acquire the pre-measurement data. In this way, it may be particularly reliably determined whether there is a need to acquire a B1 field map for the main measurement.

Evaluation of the pre-measurement data may include an analysis of the pre-measurement data. Evaluation of the pre-measurement data and/or ascertainment of the evaluation information and/or determination of whether a B1 field map needs to be measured may be carried out based on the evaluation information, in particular by way of a system control unit of the magnetic resonance apparatus. The system control unit may include one or more processors and/or one or more storage modules.

The method may furthermore include establishing that a main measurement to be carried out after the pre-measurement includes measurement of the object under examination by way of at least one dynamic pulse. It is precisely for determining the at least one dynamic pulse that the properties of the B1 field may be of particular importance. In the presence, in particular, of a B1 field with high inhomogeneity, this inhomogeneity may be particularly advantageous when determining the at least one dynamic pulse. In contrast, in the presence of a B1 field with low inhomogeneity, this inhomogeneity may be disregarded when determining the at least one dynamic pulse.

The dynamic pulse may take the form of an RF transmit pulse, the phase and/or amplitude of which varies over the course of the pulse, while an in particular predetermined gradient trajectory is sampled by way of a gradient coil unit of the magnetic resonance apparatus. Sampling of the gradient trajectory in particular proceeds at the same time as the variation of phase and/or amplitude of the RF transmit pulse.

It is also conceivable to consider the RF transmit pulse and gradient trajectory as a whole as the dynamic pulse. The RF transmit pulse would then be part of the dynamic pulse.

"pTx" here denotes "parallel transmission." A pTx pulse may include a plurality of sub-pulses, which are transmitted in parallel, in particular simultaneously, in each case by a transmit coil of a radio-frequency antenna unit of the magnetic resonance apparatus. Each transmit coil may in turn have a transmit channel assigned to the transmit coil. The sub-pulses may differ in shape and/or amplitude and/or phase. The sub-pulses may moreover display a time delay relative to one another. For example, an emissible RF transmit pulse is composed of a plurality of sub-pulses, which differ from one another and may in each case be transmitted by a transmit coil of a multichannel transmit coil assembly of the radio-frequency antenna unit. At least some of the plurality of sub-pulses, (e.g., all the sub-pulses), may be dynamic pulses.

A dynamic pulse may advantageously provide more precise control of the B1 field generated thereby. Such control may be particularly advantageous in applications with a reduced field of view, shaped saturation bands, or to reduce the specific absorption rate (SAR). In particular, a pTx pulse may be used to compensate magnetic field inhomogeneities (for example in the course of "RF shimming"), which may be particularly advantageous at higher field strengths of the main magnetic field from 7 tesla upward.

On transmission of a dynamic pulse, in particular a pTx pulse, a predetermined spatial distribution of the excitation may advantageously be achieved, as an additional degree of freedom through interference of the signals of the plurality of transmit channels, over a plurality of transmit coils of the radio-frequency antenna unit, this being adjusted on determination of the dynamic pulse for example by varying phase and amplitude.

The at least one shape and/or amplitude and/or phase of the RF transmit pulse or of a sub-pulse may correspond to a shape and/or amplitude and/or phase of a voltage pulse applied to the respective transmit coil, and/or of a current pulse which is flowing through the transmit coil.

The at least one shape and/or amplitude and/or phase of the gradient pulse may correspond to a shape and/or amplitude and/or phase of a voltage pulse applied to the gradient coil unit, and/or of a current pulse which is flowing through the gradient coil unit.

The magnetic resonance apparatus may have a main magnet for generating a main magnetic field, wherein the field strength of the main magnetic field amounts to less than 3 tesla, in particular less than 2 tesla. It is precisely at such low field strengths that the proposed method for operating the magnetic resonance apparatus may be used particularly effectively, because the B1 effects then arising may be of such a long wavelength that measurement of a B1 map is not absolutely necessary.

If a B1 field map does need to be measured, the method may include carrying out a measurement of a B1 field map by way of the magnetic resonance apparatus, determining the at least one dynamic pulse while taking account of the B1 field map, and carrying out the main measurement of the object under examination by way of the magnetic resonance apparatus using the at least one dynamic pulse.

The pre-measurement data may cover a pre-measurement field of view, wherein evaluation of the pre-measurement data includes ascertaining signal intensity fluctuations within the pre-measurement field of view.

Field of view (FOV) may refer to an image area to be measured. The image area to be measured may be square. The size of the field of view may be expressed in "mm× mm." The smaller the field of view, the higher conventionally the spatial resolution, if the voxels become smaller with the same matrix size (pixel size=FOV/matrix). However, smaller voxels may contain less signal.

Ascertainment of the signal intensity fluctuations may proceed with the assistance of a filter and/or threshold value. The greater the signal intensity fluctuations, the greater conventionally the benefit arising from a measurement of a B1 field map, in particular when determining a dynamic pulse.

Measurement of a B1 field map may be carried out if the signal intensity fluctuations exceed a specified amount. This amount may be dependent on a distribution, in particular a density and/or frequency and/or a periodicity, and/or a strength of signal intensity fluctuations.

Evaluation of the pre-measurement data may include a comparison of signal intensities in comparison areas, (e.g., image areas), with comparable structure and/or material composition, (e.g., with identical substances), within the object under examination. In particular, signal intensity homogeneity in the comparison areas is compared. For example, identical substances in the comparison areas may be fat, muscle tissue, and/or fluid.

The comparison areas may be characterized in that items of signal information such as mean values may be compared therein. In this respect, an averaging area may be small relative to conventional B1 effects. Such a region has a maximum extent of 2×2 cm.

In particular, at low field strengths of the main magnetic field of the magnetic resonance apparatus, the B1 effects conventionally extend over a large image area.

The comparison areas may be determined by segmentation of an image calculated from the pre-measurement data. The comparison areas may be determined by way of pattern recognition and/or landmark recognition.

One comparison area may be a cerebral hemisphere with cerebral matter. Such a comparison area may be determined with the assistance of landmarks or the identification of areas of identical substances (e.g., by way of anatomical information determined from the pre-measurement data).

Evaluation of the pre-measurement data may in particular encompass pattern recognition and/or landmark recognition, with the assistance of which substances are classified within the object under examination.

Evaluation of the pre-measurement data may include the application of a trained function to the pre-measurement data to generate evaluation information.

The trained function may be trained using a machine learning algorithm. The trained function may be trained by way of training data, which suitable data pairs from training pre-measurement data and training decision data. The training decision data may include information as to whether, in the presence of the associated training pre-measurement data, a B1 field map needs to be measured.

If a B1 field map does not need to be measured, the method may include determining at least one dynamic pulse (without a B1 field map having previously been measured) and carrying out the main measurement of the object under examination by way of the magnetic resonance apparatus using the at least one dynamic pulse.

In this case, measurement of the B1 field map may advantageously be dispensed with and in this way the overall examination time of the object under examination may be reduced.

If a B1 field map does not need to be measured, the method in particular includes determining at least one dynamic pulse, while taking account of the evaluation information and/or an item of field information ascertained from the pre-measurement data.

The field information ascertained from the pre-measurement data may include a B1 field distribution estimated with reference to the pre-measurement data. Instead of a purposely measured B1 field map, an estimated B1 field map may thus be used.

The ascertained field information may be a homogeneous field distribution, e.g., a homogeneous field distribution is assumed.

Ascertainment of the field information may include application of a trained to the pre-measurement data to produce the field information, in particular, a B1 field map.

The trained function may be trained using a machine learning algorithm. The trained function may be trained by way of training data, which includes suitable data pairs from training pre-measurement data and training field information. An item of training field information may include a training B1 field map. The trained function is in particular trained from suitable data pairs of pre-measurement data and associated B1 field maps.

A further embodiment of the method provides for the pre-measurement data to include data from at least one sample (e.g., from at least one sensor), wherein evaluation of the pre-measurement data includes evaluation of signal intensities of the at least one sample.

The at least one sensor is advantageously MR-visible, in particular detectable with the assistance of magnetic resonance signals. During pre-measurement, the at least one sensor may be arranged in a pre-measurement field of view.

The at least one sensor is arranged, for example, in or on a coil, in particular a local coil, of the magnetic resonance apparatus.

Furthermore, a magnetic resonance apparatus is proposed which is configured to carry out an above-described method. The advantages of the proposed magnetic resonance apparatus correspond to the advantages of the method for operating a magnetic resonance apparatus, which have been described in detail above. Features, advantages, or alternative embodiments mentioned in this connection are likewise also applicable to the other claimed subjects and vice versa.

Furthermore, a computer program product is proposed that includes a program and is directly loadable into a memory of a programmable system control unit of a magnetic resonance apparatus and has program means, (e.g., libraries and auxiliary functions), for performing a proposed method for operating a magnetic resonance apparatus when the computer program product is executed in the system control unit of the magnetic resonance apparatus. The computer program product may include software with source code that has yet to be compiled and linked or has merely to be interpreted, or executable software code that has merely to be loaded into the system control unit for execution. As a result of the computer program product, the method may be carried out quickly, identically repeatably, and robustly. The computer program product is configured such that the computer program product may carry out the method acts by way of the system control unit. The system control unit, in each case, includes the prerequisites such as an appropriate working memory, an appropriate graphics card, or an appropriate logic unit for it to be possible to carry out the respective method acts efficiently. The computer program product may be stored on a computer-readable medium or saved to a network or server, wherein the computer program product may be loaded into the processor of a local system control unit that may be directly connected with the magnetic resonance apparatus or may be configured as part of the magnetic resonance apparatus. Control information for the computer program product may furthermore be stored on an electronically readable data storage medium.

The control information of the electronically readable data storage medium may be designed such that, when the data storage medium is used in a system control unit of a magnetic resonance apparatus, it carries out a method. Examples of electronically readable data storage media are a DVD, a magnetic tape, or a USB stick on which electronically readable control information, in particular software, is stored. If this control information is read from the data storage medium and stored in a system control unit of the magnetic resonance apparatus, all the embodiments of the previously described methods may be carried out. The disclosure may accordingly also be based on said computer-readable medium and/or said electronically readable data storage medium.

Further advantages, features, and details of the disclosure are revealed by the exemplary embodiments described below with reference to the drawings. Mutually corresponding parts are provided with the same reference numerals in all the figures.

BRIEF DESCRIPTION OF THE DRAWINGS

FIG. 3 depicts an example of a representation of pre-measurement data.

DETAILED DESCRIPTION

Figure 1:
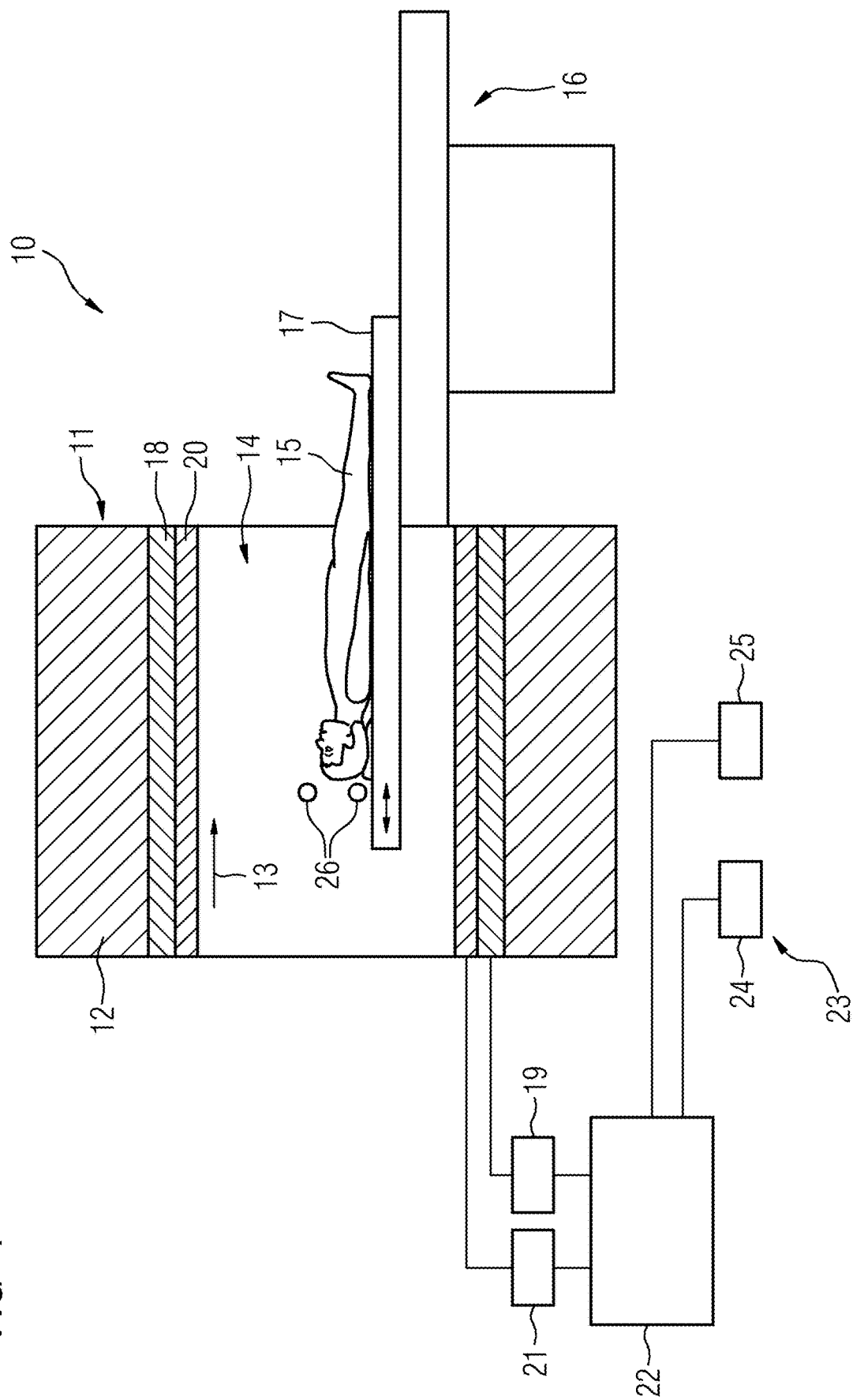
FIG. 1 depicts an example of a schematic representation of a magnetic resonance apparatus.

FIG. 1 is a schematic representation of a magnetic resonance apparatus 10. The magnetic resonance apparatus 10 includes a magnet unit 11, which includes a main magnet 12 for generating a strong and in particular time-constant main magnetic field 13. The magnetic resonance apparatus 10 additionally includes a patient accommodation zone 14 for accommodating a patient 15. Two probes or sensors 26 are arranged in the vicinity of the patient 15. In the present exemplary embodiment, the patient accommodation zone 14 is of cylindrical construction and is cylindrically surrounded in a circumferential direction by the magnet unit 11. In principle, however, the patient accommodation zone 14 may at any time be formed in a manner which differs therefrom. The patient 15 may be advanced into the patient accommodation zone 14 by way of a patient positioning apparatus 16 of the magnetic resonance apparatus 10. The patient positioning apparatus 16 includes a patient table 17 that is movable within the patient accommodation zone 14.

The magnet unit 11 furthermore includes a gradient coil unit 18 for generating magnetic field gradients which are used for spatial encoding during imaging. The gradient coil unit 18 is controlled by way of a gradient control unit 19 of the magnetic resonance apparatus 10. The magnet unit 11 further includes a radio-frequency antenna unit 20, which is configured in the present exemplary embodiment as a body coil permanently integrated into the magnetic resonance apparatus 10. The radio-frequency antenna unit 20 has a plurality of transmit coils, such that the magnetic resonance apparatus 10 is configured to produce pTx pulses.

The radio-frequency antenna unit 20 is controlled by a radio-frequency antenna control unit 21 of the magnetic resonance apparatus 10 and emits radio-frequency magnetic resonance sequences into an examination chamber that is formed by a patient accommodation zone 14 of the magnetic resonance apparatus 10. In this way, excitation of atomic nuclei is established in the main magnetic field 13 generated by the main magnet 12. Magnetic resonance signals are generated by relaxation of the excited atomic nuclei. The radio-frequency antenna unit 20 is configured to receive magnetic resonance signals.

The magnetic resonance apparatus 10 includes a system control unit 22 for controlling the main magnet 12 and the gradient control unit 19 and for controlling the radio-frequency antenna control unit 21. The system control unit 22 provides central control of the magnetic resonance apparatus 10, e.g., for carrying out a predetermined imaging gradient echo sequence. In addition, the system control unit 22 includes an evaluation unit, not shown in greater detail, for evaluating the magnetic resonance signals which are acquired during the magnetic resonance examination.

The magnetic resonance apparatus 10 furthermore includes a user interface 23 which is connected to the system control unit 22. Control information, such as for example imaging parameters, and reconstructed magnetic resonance images may be displayed on a display unit 24, (e.g., on at least one monitor), of the user interface 23 for a medical operator. The user interface 23 furthermore includes an input unit 25, by way of which information and/or parameters may be input by the medical operator during a measurement procedure.

Figure 2:
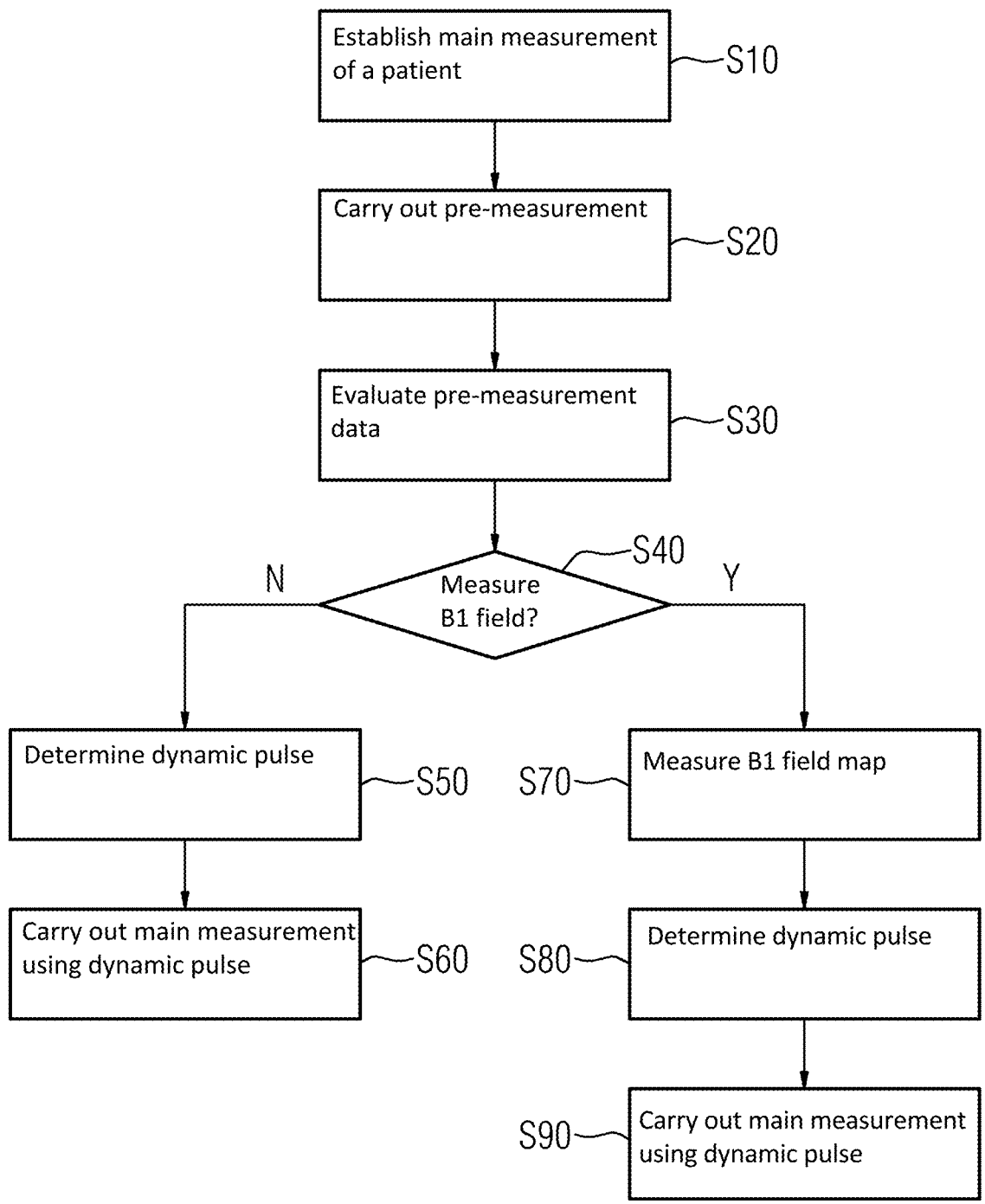
FIG. 2 depicts an example of a method for operating a magnetic resonance apparatus.

FIG. 2 shows a method for operating the magnetic resonance apparatus 10. S10 establishes that, after a pre-measurement, a main measurement of the patient 15 is carried out, wherein at least one dynamic pulse, in particular pTx pulse, is used during the main measurement.

In S20, pre-measurement is carried out by way of the magnetic resonance apparatus 10, wherein carrying out the pre-measurement includes acquiring pre-measurement data for the patient 15.

In S30, evaluation information is ascertained by evaluating the pre-measurement data.

In S40, the evaluation information is used to ascertain whether a B1 field map needs to be measured.

If, according to S40, a B1 field map does not need to be measured, in S50, at least one dynamic pulse is determined. In S60, the main measurement of the patient 15 is carried out by way of the magnetic resonance apparatus 10 using the at least one dynamic pulse determined in S60.

If, according to S40, a B1 field map does need to be measured, in S70, a B1 field map is measured by way of the magnetic resonance apparatus 10. While taking account of the B1 field map measured in S70, in S80, at least one dynamic pulse is determined. In S90, the main measurement of the object under examination is carried out by way of the magnetic resonance apparatus 10 using the at least one dynamic pulse determined in S80.

The proposed method, in particular, in S20, S30, and S40, makes it possible to estimate the need for a B1 field map for preparation of a dynamic pulse. In certain cases, e.g., at low field strengths of the main magnetic field 13 of, for example, 1.5 T or less, it is thus possible to dispense with actual acquisition of this B1 field map. The method is characterized in that data from measurements already performed in S20 is evaluated in S30 for the stated estimation. The evaluation in S30 may allow a direct conclusion to be drawn about a rough B1 field distribution through suitable analysis of this data, which may be sufficient for calculating certain categories of dynamic pulse.

The pre-measurement in S20 may take place at the start of an MR examination of a patient 15. The pre-measurement may include measurements for frequency adjustment, coil illumination, shimming, etc. Still in the course of pre-measurement, first image-generating (but not diagnostic) measurement then follows, (e.g., a localizer measurement or an AutoAlign measurement), with which an overview of the area of the patient 15 to be measured is prepared. Pre-measurement provides a result in the form of pre-measurement data.

There are several possible options for evaluating the pre-measurement data in S30. For example, using suitable filters and threshold values, intensity fluctuations may be found which provide conclusions about the B1 distribution which is present. It may be decided as a function of the severity and frequency of the variations whether actual acquisition of a B1 field map is necessary or whether for example a homogeneous approximation reproduces reality sufficiently well. In the process, pre-examinations (such as the localizer) may be evaluated to the effect that the signal intensities are compared in areas with identical substances, such as areas with fat, muscle tissue, or fluid etc. In this regard, methods for pattern and landmark recognition (e.g., for AutoAlign) may be used, with the assistance of which, for example, substances in the patient 15 may be classified.

Another possible option for evaluating the pre-measurement data in S30 includes using a trained function, in particular a neural network. The function or the network may be trained by suitable data pairs of prior captures and associated B1 field maps in order, depending on the particular application, to classify the localizer and/or AutoAlign data according to the need for acquisition of a B1 field map; a classification algorithm may be used for this purpose.

The use of a trained function enables not only the provision of a basis for the decision in S40 but also the generation of an approximate B1 distribution. The trained function may, for example, ascertain through a suitable structure and corresponding training data an approximation of the B1 field map that may be used in S50. To this end, a regression algorithm may be used. However, even without using a trained function it is conceivable, with the assistance of the pre-measurement data, to make an estimate of the B1 distribution, in particular from an analysis of the intensity variations.

According to a further possible aspect, MR-visible sensors 26 may be placed in the surroundings of the object under examination, (e.g., the patient 15) (for example, in a local coil not shown in FIG. 1 which may be arranged directly on the patient 15), and the signal intensity of these sensors 26 in the pre-measurement data may be evaluated, in particular in S30.

FIG. 3 represents, by way of example, an evaluation of pre-measurement data in S30. Here, pre-measurement data covers a field of view FOV of the pre-measurement from S20. When evaluating the pre-measurement data in S30, signal intensity fluctuations within the pre-measurement field of view FOV are ascertained. The brain of a patient 15 is shown schematically, with a left cerebral hemisphere and a right cerebral hemisphere. The areas A1 and A2 belonging to the cerebral hemispheres may for example be ascertained by way of pattern recognition and/or landmark recognition.

When evaluating the pre-measurement data in S30, signal intensities in comparison areas of the patient 15 with comparable structure and/or material composition are compared. Areas A1 and A2 are such comparison areas. If the signal intensity fluctuations exceed a specified amount, a B1 field map is measured in S70.

Evaluation of the pre-measurement data shown in FIG. 3 may also proceed with the assistance of a neural network. In particular, a trained function may be applied to the pre-measurement data in order to produce the evaluation information in S30.

In particular if, according to S40, a B1 field map does not need to be measured, the evaluation information and/or an item of field information ascertained from the pre-measurement data may be taken into account to generate at least one dynamic pulse in S50. Here too, a trained function may be used to ascertain the field information.

The pre-measurement data shown in the image according to FIG. 3 also includes data from two sensors 26 with the associated areas A3 and A4. These areas A3 and A4 may also serve as comparison areas. Evaluation of the pre-measurement data may include evaluation of signal intensities of the sensors 26 in the associated areas A3 and A4.

It should again be noted that the method described above in detail and the depicted magnetic resonance apparatus 10 are merely exemplary embodiments which may be modified in the most varied manner by a person skilled in the art without departing from the scope of the disclosure. Furthermore, use of the indefinite article "a" does not rule out the possibility of a plurality of the features in question also being present. Likewise, the term "unit" does not rule out the possibility of the components in question including a plurality of interacting subcomponents which may optionally also be spatially distributed.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance apparatus, the method comprising:
    carrying out a pre-measurement by the magnetic resonance apparatus, wherein the carrying out of the pre-measurement comprises acquiring pre-measurement data for an object under examination;
    ascertaining evaluation information by evaluating the pre-measurement data;
    determining whether a B1 field map needs to be measured using the evaluation information;
    calculating at least one dynamic pulse when determined that the B1 field map does not need to be measured, wherein the calculating of the at least one dynamic pulse takes into account of the evaluation information and/or an item of field information ascertained from the pre-measurement data; and
    carrying out a main measurement of the object under examination by the magnetic resonance apparatus using the at least one dynamic pulse.

2. A magnetic resonance apparatus comprising:
    at least one processor configured to:
        carry out a pre-measurement by the magnetic resonance apparatus, wherein the carrying out of the pre-measurement comprises acquiring pre-measurement data for an object under examination;
        ascertain evaluation information by evaluating the pre-measurement data;
        determine whether a B1 field map needs to be measured using the evaluation information;
        calculate at least one dynamic pulse when determined that the B1 field map does not need to be measured, wherein the calculating of the at least one dynamic pulse takes into account of the evaluation information and/or an item of field information ascertained from the pre-measurement data; and
        carry out a main measurement of the object under examination by the magnetic resonance apparatus using the at least one dynamic pulse.

3. A non-transitory computer readable medium having computer program product comprising a program, wherein the program is configured to be directly loadable into a memory of a programmable system control unit of a magnetic resonance apparatus, and wherein the program, when executed in the programmable system control unit of the magnetic resonance apparatus, causes the magnetic resonance apparatus to:
    carry out a pre-measurement by the magnetic resonance apparatus, wherein the carrying out of the pre-measurement comprises acquiring pre-measurement data for an object under examination;

ascertain evaluation information by evaluating the pre-measurement data;

determine whether a B1 field map needs to be measured using the evaluation information;

calculate at least one dynamic pulse when determined that the B1 field map does not need to be measured, wherein the calculating of the at least one dynamic pulse takes into account of the evaluation information and/or an item of field information ascertained from the pre-measurement data; and carry out a main measurement of the object under examination by the magnetic resonance apparatus using the at least one dynamic pulse.

4. The method of claim 1, further comprising:

measuring the B1 field map by the magnetic resonance apparatus when determined that the B1 field map needs to be measured; and calculating the at least one dynamic pulse while taking account of the B1 field map.

5. The method of claim 1, wherein the pre-measurement data covers a pre-measurement field of view, and wherein the evaluating of the pre-measurement data comprises ascertaining signal intensity fluctuations within the pre-measurement field of view.

6. The method of claim 1, wherein the evaluating of the pre-measurement data comprises comparing signal intensities in image areas with within the object under examination.

7. The method of claim 1, wherein the evaluating of the pre-measurement data comprises applying a trained function to the pre-measurement data to produce the evaluation information.

8. The method of claim 1, wherein the ascertaining of the item of field information comprises applying a trained function to the pre-measurement data to produce the item of field information.

9. The method of claim 1, wherein the pre-measurement data comprises data from at least one sample, and wherein the evaluating of the pre-measurement data comprises evaluating signal intensities of the at least one sample.

10. The method of claim 4, wherein the pre-measurement data covers a pre-measurement field of view, and wherein the evaluating of the pre-measurement data comprises ascertaining signal intensity fluctuations within the pre-measurement field of view.

11. The method of claim 5, wherein the B1 field map needs to be measured when the signal intensity fluctuations exceed a specified amount.

12. The method of claim 6, wherein the image areas have identical substances.

13. The method of claim 6, wherein the image areas are determined by way of pattern recognition and/or landmark recognition.

14. The method of claim 10, wherein the B1 field map needs to be measured when the signal intensity fluctuations exceed a specified amount.

* * * * *